United States Patent
Zagdoun

(10) Patent No.: US 7,459,641 B2
(45) Date of Patent: Dec. 2, 2008

(54) OPTICAL FILTERING AND ELECTROMAGNETIC ARMOURING STRUCTURE

(75) Inventor: Georges Zagdoun, La Garenne Colombes (FR)

(73) Assignee: Saint-Gobain Glass France, Courbevoie (FR)

( * ) Notice: Subject to any disclaimer, the term of this patent is extended or adjusted under 35 U.S.C. 154(b) by 0 days.

(21) Appl. No.: 10/523,028

(22) PCT Filed: Jul. 30, 2003

(86) PCT No.: PCT/FR03/02416

§ 371 (c)(1),
(2), (4) Date: Aug. 10, 2005

(87) PCT Pub. No.: WO2004/016053

PCT Pub. Date: Feb. 19, 2004

(65) Prior Publication Data

US 2006/0008597 A1  Jan. 12, 2006

(30) Foreign Application Priority Data

Aug. 5, 2002 (FR) .................................. 02 09925
Apr. 14, 2003 (FR) .................................. 03 04636

(51) Int. Cl.
*H05K 9/00* (2006.01)

(52) U.S. Cl. ........................ 174/381; 174/389; 174/392

(58) Field of Classification Search .............. 174/357, 174/381, 388, 389, 390, 392; 361/800, 816, 361/818; 313/112, 477 R, 479; 348/818, 348/819, 835; 428/332, 333

See application file for complete search history.

(56) References Cited

U.S. PATENT DOCUMENTS

| | | | | |
|---|---|---|---|---|
| 4,683,398 A | * | 7/1987 | Vriens et al. | 313/474 |
| 5,989,785 A | * | 11/1999 | Ishihara et al. | 430/317 |
| 6,650,052 B1 | * | 11/2003 | Sohn et al. | 313/586 |
| 6,686,536 B2 | * | 2/2004 | Tone et al. | 174/389 |
| 6,686,896 B2 | * | 2/2004 | Oishi et al. | 345/60 |
| 6,856,390 B2 | * | 2/2005 | Nordman et al. | 356/344 |
| 6,886,964 B2 | * | 5/2005 | Gardiner et al. | 362/276 |
| 6,965,191 B2 | * | 11/2005 | Koike et al. | 313/112 |

(Continued)

FOREIGN PATENT DOCUMENTS

| | | |
|---|---|---|
| EP | 0 990 928 | 4/2000 |
| EP | 1 196 018 | 4/2002 |
| EP | 1 199 738 | 4/2002 |
| JP | 11 073115 | 3/1999 |
| JP | 11 194215 | 7/1999 |
| WO | 01 78630 | 10/2001 |

*Primary Examiner*—Hung V Ngo
(74) *Attorney, Agent, or Firm*—Oblon, Spivak, McClelland, Maier & Neustadt, P.C.

(57) ABSTRACT

An optical filtering/electromagnetic screening structure for being joined to at least one transparent substrate, especially made of glass. The structure includes at least two plastic sheets and including, or intended to be joined to the sheets, a conducting electromagnetic screening element. At least one sheet is made of a thermoplastic, the other sheet constitutes a sheet for covering the conducting element or the thermoplastic sheet, and either one or both of the two sheets incorporate at least one mineral pigment or at least one organic dye to produce, in respect of the structure, an orange filter for light of wavelength centered on 590 nm.

20 Claims, 1 Drawing Sheet

U.S. PATENT DOCUMENTS

| | | | |
|---|---|---|---|
| 6,989,112 B2 * | 1/2006 | Teng et al. | 252/582 |
| 2004/0204555 A1 * | 10/2004 | Noda et al. | 526/242 |
| 2005/0042531 A1 * | 2/2005 | Lee et al. | 430/7 |
| 2005/0179368 A1 * | 8/2005 | Ryu et al. | 313/504 |
| 2005/0186421 A1 * | 8/2005 | Choi et al. | 428/355 AC |
| 2006/0115750 A1 * | 6/2006 | Lee et al. | 430/7 |

* cited by examiner

OPTICAL FILTERING AND ELECTROMAGNETIC ARMOURING STRUCTURE

BACKGROUND OF THE INVENTION

1. Field of the Invention

The subject of the invention is an optical filtering/electromagnetic screening structure for being joined to at least one transparent substrate, especially made of glass, the structure comprising at least two plastic sheets and including, or intended to be joined to the sheets, a conducting electromagnetic screening element.

The invention will more particularly be described with regard to the use of such an electromagnetic screening structure for a display screen, such as a plasma screen.

2. Description of the Background

A plasma screen includes a plasma gas mixture (Ne, Xe, Ar), trapped between two glass sheets and phosphors placed on the internal face of the rear sheet of the screen. Ultraviolet light radiation emitted by the plasma gas mixture during plasma discharge between the two glass sheets interacts with the phosphors on the internal face of the rear sheet in order to produce the visible light radiation (red, green or blue). In competition with the UV emission is a gas particle de-excitation mechanism that generates infrared radiation between 800 and 1250 nm, the propagation of which, mainly through the front face of the screen, may be the cause of very substantial disturbance, especially for nearby infrared-controlled, for example, remote-controlled, equipment.

Apart from the infrared radiation generated by de-excitation of the plasma gas, intense radiation in the orange at 590 nm is also emitted by the gas mixture when the latter contains neon. This radiation in the orange may, to the viewer's eyes, be unattractive. Furthermore, it interacts with the blue and green colours of the light spectrum so that it renders an image on the display screen having blue and green colours that can be termed washed-out or faded, and a less sharp red colour.

Moreover, like all electronic appliances, plasma screens have addressing systems (drivers) that may generate parasitic radiation with respect to other devices with which they must not interfere, such as microcomputers, portable telephones, etc.

To eliminate, or at the very least reduce, the propagation of this radiation, one solution consists in placing a structure that is both transparent and metallized against the front face of the screen in order to provide electromagnetic screening.

One known type of structure consists of two sheets of a thermoplastic, particularly PVB, between which an array of metal wires in the form of a homogeneous grid is placed.

This grid may be formed from a metal wire gauze adhesively bonded between the two PVB sheets by heating the thermoplastic.

Another solution consists in etching a copper layer deposited on a transparent substrate, such as PET, using a standard photolithographic technique, and joining this substrate to the PVB sheets, the PET substrate being inserted between the two PVB sheets and bonded by heating the thermoplastic.

This advantageously laminated structure, with the PVB being placed on the front of the display screen, the front face of which is a glass substrate, protects the viewer should the screen fracture, by retaining the glass fragments.

The metal gauze therefore provides electromagnetic screening. However, it is always desirable to improve the performance of an electromagnetic screening filter by further reducing the transmission of radiation in the infrared and to find other filtering properties therein, such as the ability to cut out a substantial amount of the orange colour. Furthermore, it is of course desirable for the colour rendering as perceived by the viewer on the screen to be optimum.

A known type of filter for motor-vehicle windows that cuts out certain wavelengths is a combination of two PVB sheets, one of which consists of 3M's product called "Solar Reflective Film" and the other of which consists of a Sekisui S-Lec® PVB film sold by Sekisui. The 3M product and Sekisui PVB film are transparent and neutral in transmission, the Sekisui film furthermore containing conducting particles. This filter has the advantage of transmitting only 51% of the light, but this light is predominately in the yellow, the dominant wavelength of which is 561 nm, which significantly modifies the colour rendering on a display screen. The light also has a purity of 8%, which is regarded as significant compared with a desired level of less than or equal to 7%. It will be recalled that the purity is defined in the 1931 CIE measurement system. In this system, the colour of an object is represented by a point with coordinates x, y. Purity is the ratio of the length of the segments, of which one joins the illuminant to the end of the spectrum locus and passes through the coordinate point x, y and the other of which joins the illuminate to the coordinate point x, y respectively. Furthermore, although this filter makes it possible to obtain transmission in the infrared at 1200 nm of at most 5%, the transmission still remains 13% at 850 nm. Finally, the orange colour is not cut out sufficiently, the transmission for the corresponding wavelength being 64%.

SUMMARY OF THE INVENTION

The object of the invention is therefore to provide an optical filtering/electromagnetic screening structure that makes it possible on the one hand, to cut out sufficient orange colour of wavelength centred on 590 nm, and on the other hand, to further increase the filter performance in the infrared, by obtaining transmitted light suitable for not changing the purity of the colours and for optimizing the contrast of the visible image on a display screen with which such a structure is associated.

Thus, the inventors have produced an electromagnetic screening structure that is characterized in that at least one sheet is made of a thermoplastic, the other sheet constitutes a sheet for covering the conducting element or the thermoplastic sheet, and either one or both of the two sheets incorporate at least one mineral pigment or at least one organic dye so as to produce, in respect of the structure, an orange filter for light of wavelength centred on 590 nm.

According to one feature, at least one of the sheets, namely the thermoplastic sheet and/or the covering sheet, incorporates at least one mineral pigment or at least one organic dye in order to form an infrared filter in the 800 to 1250 nm wavelength range.

According to one embodiment, one of the two sheets is neutral while the other sheet includes at least two pigments or dyes that provide, through the structure, the orange filter and the infrared filter, respectively.

According to another embodiment, the thermoplastic sheet includes a pigment or a dye that provides, through the structure, the orange filter or the infrared filter and the covering sheet includes a pigment or dye that provides the orange filter or the infrared filter that the other, thermoplastic, sheet does not provide.

According to a first variant, the conducting element is formed from a metal wire gauze joined between the two sheets.

According to a second variant, the conducting element is formed from a metal wire mesh deposited on a support sheet whose composition is based on one of the following materials: polycarbonate, polymethyl (meth)acrylate, polyethylene terephthalate, polyethersulphone, polyetherketone and acrylonitrile-styrene copolymer.

Advantageously, according to this second variant, the support sheet for the conducting element constitutes the covering sheet, the conducting element being placed between the thermoplastic first sheet and the covering sheet.

Preferably, the covering sheet bearing the conducting element is coated on the opposite side from the conducting element with a protective film made of polyethylene terephthalate (PET), or of polyvinyl chloride (PVC) or of polypropylene or of high-density polyethylene, with a thickness of less than or equal to 60 μm.

According to a third variant, the conducting element is formed from a metal layer, such as one based on silver, deposited on a support sheet that is formed by the covering sheet, the said element being placed between the covering sheet and the thermoplastic first sheet.

According to another feature, the support sheet for the conducting element is formed from a complementary plastic sheet that is laminated between the thermoplastic first sheet and the covering sheet.

Advantageously, the thermoplastic first sheet and the covering sheet when it does not constitute a support sheet for the conducting element are made of polyvinyl butyral, or of polyurethane, or of ethylene-vinyl acetate.

The structure may be joined to a single transparent substrate, the thermoplastic first sheet being joined to the substrate.

According to another variant, the structure may be laminated between two transparent substrates, the thermoplastic sheet and the covering sheet being joined to each of the substrates, respectively.

According to one feature, the transparent substrate has, on its face that faces the thermoplastic sheet, a metal layer such as one based on silver in order to form the conducting element when the latter is joined to the structure.

The structure thus provides, in respect of the structure/substrate(s) assembly, an infrared filter with a corresponding light transmission $T_{IR}$ not exceeding 17%, and an orange filter with a corresponding light transmission $T_{NE}$ of between 20% and 40%, the structure/substrate(s) assembly having a light transmission coefficient in the visible of between 40% and 60%, with a less than 7% purity.

More particularly, the infrared filter ensures transmission at 815 nm of at most 17%, transmission at 870 nm of at most 9% and transmission between 900 and 1250 nm of at most 9%.

The structure of the invention may, for example, be combined with the front face of a display screen, such as a plasma screen. It may also be combined with any device requiring electromagnetic screening and filters in the infrared and in the orange.

In the case of a display screen, the glass substrate or substrates to which the structure is joined are made of toughened glass. Preferably, at least one of the glass substrates has an antireflection coating on the opposite face from the structure. Advantageously, the covering sheet has an antireflection coating on the opposite face from the thermoplastic first sheet. Finally, the structure may be adhesively bonded directly to the front face of the screen.

BRIEF DESCRIPTION OF THE DRAWINGS

Other features and advantages of the invention will become apparent on reading the description that follows, in conjunction with the appended drawings, in which:

FIGS. 3, 4 and 5 are sectional views of the structure of the invention combined with the front face of a display screen according to several embodiments.

BRIEF DESCRIPTION OF THE PREFERRED EMBODIMENTS

Figure 1:
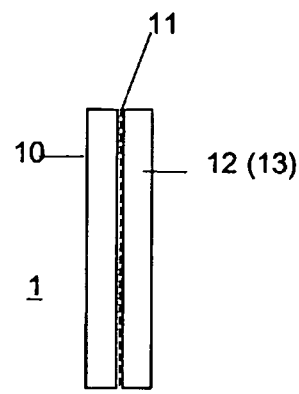
FIG. 1 is a sectional view of the structure of the invention.

Firstly, it should be pointed out that the relative proportions of various dimensions, especially the thicknesses, of the elements of the invention have not been drawn to scale in the drawings so that they are easier to examine.

Figure 2:
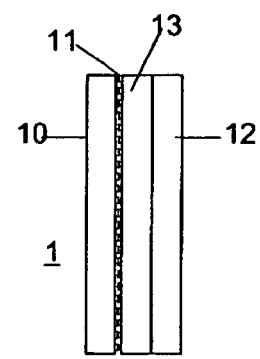
FIGS. 2 and 5 are sectional views of alternative embodiments of the structure of the invention.

The optical filtering/electromagnetic screening structure 1 illustrated in FIGS. 1 and 2 is to be joined to at least one transparent substrate, such as a glass substrate, the substrate being more particularly intended to be mechanically assembled with a display screen so that the structure constitutes, for the screen, an orange filter, and complementarily, if necessary, an infrared filter.

The display screen is, for example, a plasma screen, the latter particularly emitting radiation in the orange because of the neon contained in the gas mixture of the screen. However, this use of the structure is not limited to plasma screens and it can be used and combined with any device requiring an orange filter.

The optical filtering/electromagnetic screening structure 1 comprises a thermoplastic first sheet 10 and a plastic second sheet 12 that constitutes a covering sheet for the element with which it is combined. A conducting electromagnetic screening element 11 lies between the two sheets 10 and 12 or is intended to be joined to the sheets when it is not included within the structure.

The conducting element 11 may, according to a first embodiment, be a metal wire gauze, of the type made of copper, which is inserted between the two sheets 10 and 12 and joined together by heating the two sheets. In this case, the covering sheet 12 is preferably made of the same material as the first sheet 10, namely polyvinyl butyral, or polyurethane, or ethylene-vinyl acetate.

According to a second embodiment, the conducting element 11 is a metal wire mesh, of the type made of copper, obtained by a standard photolithographic technique on a support sheet made of a plastic based on one of the following materials: polycarbonate, polymethyl (meth)acrylate, polyethylene terephthalate, polyethersulphone, polyetherketone and acrylonitrile-styrene copolymer.

In this second variant, the support sheet for the conducting element 11 may advantageously be the covering sheet 12 which is then joined to the first sheet 10 so that the conducting element is placed between the two sheets, the sheets being joined together by heating the materials (FIG. 1). Alternatively, the support sheet for the conducting element 11 may instead be formed from a complementary sheet 13 which is laminated between the first and second sheets 10 and 12, which are then preferably both made of one of the following thermoplastics: polyvinyl butyral, or polyurethane, or ethylene-vinyl acetate (FIG. 2).

According to a third variant, the conducting element 11 is a silver-based layer deposited on a support sheet made of a plastic based on one of the following materials: polycarbonate, polymethyl (meth)acrylate, polyethylene terephthalate, polyethersulphone, polyetherketone, and acrylonitrile-styrene copolymer. This support sheet may advantageously be the covering sheet 12, the layer being placed between the two sheets 10 and 12 (FIG. 1).

Figure 5:
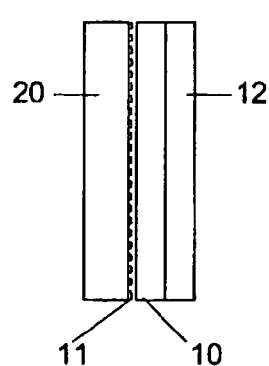

When the conducting element 11 constituting an electromagnetic screening element is not incorporated into the structure 1, but is joined to it, the element is for example in the form of a metal layer, such as a silver-based layer, deposited on the substrate for which the structure is intended, the layer facing the first sheet 10 that will be joined to the substrate. This is the example of FIG. 5, which shows a substrate 20 having a face that is provided with the conducting element 11, to which substrate the structure 1 comprising the first thermoplastic sheet 10 and the covering sheet 12 is joined. The covering sheet makes it possible to provide a function other than the function(s) fulfilled by the sheet 10, or to protect the sheet 10 if this is made of a material that can be easily scratched for example, or else to make it easier to join the sheet 10 to the element that will be placed against the substrate.

For better electromagnetic screening, it will be preferable for the conducting element to be the metal wire mesh rather than a metal layer.

The optical filter according to the invention is obtained in the following manner: one or other of the two sheets 10 and 12 or both sheets 10 and 12 include at least one mineral pigment or at least one organic dye in order to constitute an orange filter corresponding to light of 590 nm wavelength. The product FILTRON A178 or A193 sold by Gentex is an example of a dye that can be incorporated into a polymeric sheet in order to form an orange filter.

The thermoplastic first sheet 10 is made of polyvinyl butyral, or polyurethane, or ethylene-vinyl acetate.

The covering second sheet 12 is made of a plastic that depends on the function provided by this sheet, other than that of an orange filter. Examples of materials were mentioned above according to the variant in question for the conducting element.

According to the invention, the structure 1 may also include means for constituting an infrared filter. As in the case of the orange filter, at least one pigment or at least one dye may be incorporated into one of the sheets 10 or 12 of the structure, or in both sheets, in order to form the infrared filter. An example of a dye for the infrared filter is the product FILTRON A195 or A101 sold by Gentex.

Thus, at least one of the sheets 10 or 12, or at least the complementary sheet 13 when it is laminated between the two sheets 10 and 12, includes at least one pigment and/or at least one dye so that the structure 1 constitutes, on the one hand, an infrared filter corresponding to wavelengths ranging from 800 to 1250 nm, and on the other hand, an orange filter corresponding to a wavelength centred on 590 nm.

Several alternative embodiments of the structure may be envisaged regarding the incorporation of dyes or pigments for infrared and orange filters.

The dye or pigment for the infrared filter and the dye or pigment for the orange filter are both incorporated into one of the sheets 10, 12, or 13, the sheet or sheets not containing the dyes or pigments preferably being light in colour.

As a variant, the dye or pigment for the infrared filter is incorporated into one of the sheets 10, 12 or 13, whereas the dye or pigment for the orange filter is incorporated in the sheet not containing the dye or pigment for the infrared filter.

Finally, according to the invention, the covering sheet 12 has, on the opposite face from that provided with the conducting element 11 when the latter is supported by the sheet, a protective film 14. This film is in the form of a sheet of polyethylene terephthalate (PET), or polyvinyl chloride (PVC) or polypropylene or high-density polyethylene. Its thickness is less than or equal to 60 µm. Firstly, it allows the opposite face from that bearing the conducting element to be protected so as to avoid any scratching of this face by the conducting element when the sheet is in the form of a roll for delivery. Secondly, this protective film serves to create a clean surface for the purpose of joining the covering sheet to another surface.

The structure 1 as described above may therefore be joined to a transparent substrate 20 such as a glass substrate, or be laminated between two glass-type transparent substrates 20 and 21 in order to form the front face 2 of a display screen E, that is to say the part turned towards the viewer.

Figure 3:
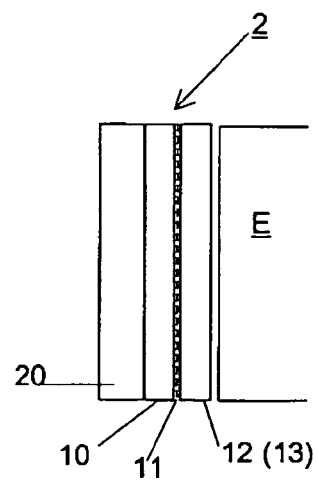

One example (Example 1) of assembling the front face of a screen is obtained by joining a structure 1 to a single substrate 20, comprising (FIG. 3):
the substrate 20 facing the viewer;
the thermoplastic first sheet 10, made of PVB and joined to the substrate 20; and
the conducting electromagnetic screening element 11 which is placed on the PET covering sheet 12, this sheet being joined, on one side, to the first sheet 10 and, facing it, on the other side, to the screen E.

Figure 4:
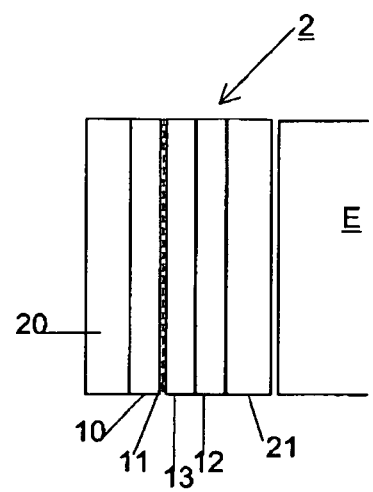

Another example (Example 2) of assembling the front face of a screen is obtained by a structure 1 laminated between two substrates 20 and 21, comprising (FIG. 4):
the glass substrate 20 facing the viewer;
the thermoplastic first sheet 10 of PVB, joined to the first glass substrate 20;
the conducting electromagnetic screening element 11 deposited on a complementary 13 of PET; and
the covering second sheet 12 of PVB joined via one of the faces to the complementary sheet 13 and via its opposite face to the second glass substrate 21.

In Examples 1 and 2, the structure/substrate(s) assembly is mechanically fixed to the screen by means of a metal frame (not shown).

The filter formed within the structure 1, joined to a single substrate (Example 1) or laminated between two glass substrates 20 and 21 (Example 2) into which were incorporated dyes of the FILTRON A195 or A101 type for absorption of a 590 nm neon line and of the FILTRON A178 or A193 type for absorption of the infrared, is defined by following light transmission properties:
a transmission $T_{IR}$ at 815 nm of at most 22%;
a transmission $T_{IR}$ at 870 nm of at most 18%;
a transmission $T_{IR}$ between 900 and 1250 nm of at most 12%; and
a transmission $T_{NE}$ at 590 nm of between 20 and 40%.

The association of dyes or pigments for the orange and infrared filters, possibly combined with other pigments or dyes absorbing in the visible, results in a structure 1 joined to the two glass substrates, the light transmission $T_L$ of which is around 40 to 60% with dominant wavelengths between 480 and 520 nm and is associated with a purity of less than 3%. The less than 3% purity, owing to other pigments or dyes, allows a grey filter to be obtained, that is to say one of neutral colour in transmission.

The infrared transmission property is assessed according to the light transmission in the visible. A filter having a high infrared transmission, for example around 16%, will necessarily correspond to a high transmission in the visible (around 47%). A compromise with therefore be chosen between transmission in the infrared and transmission in the visible. However, transmission in the orange may be adapted whatever the light transmission of the filter in the visible.

The use of orange and infrared filters may result in a structure within which the colour perceived by an observer may be a dominant colour, such as green. So as to compensate for this colour, in order to obtain a neutral grey colour that does not allow the hue of the colours rendered on the screen to be weakened, either other pigments or dyes are added, as mentioned above, or an insert of the tinted PVB type, that absorbs visible light and is used conventionally in laminated glazing units, is added.

Figure 6:
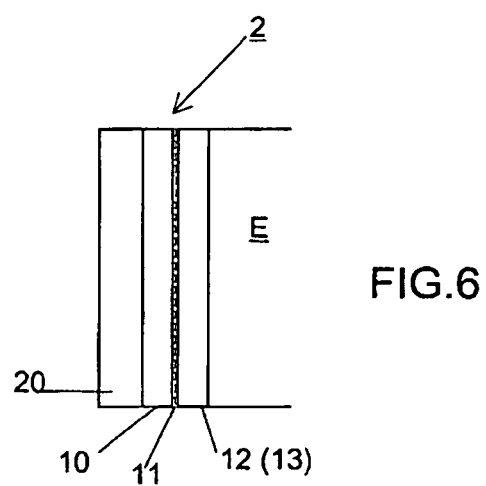
FIG. 6 is another sectional view of one embodiment of the invention.

The representation given in FIG. 6 (Example 3) is an alternative use of an optical filter for a screen made according to Example 1, which has the particular feature of being directly bonded, via the covering sheet 12, after having removed the protective film 14 if it is present, to the substrate of the front face of the screen by means of an adhesive or a resin, or by any other means known to those skilled in the art. The advantage of this method of assembly is that it eliminates optical interfaces and reduces the level of parasitic reflection.

In the three illustrative examples in which the structure is joined to one or two glass substrates respectively, and preferably in the illustrative example that most particularly has only a single glass substrate, the glass substrate or substrates are made of toughened glass. Toughened glass is mechanically very strong and very difficult to break. Thus, in the first and third illustrative examples, the thickness of the total filter—the screen, the structure 1 and the glass substrate 20—may advantageously be less than the thickness of the filter of the second illustrative example, which includes two glass substrates, while still having the properties of protecting the viewer.

Furthermore, in these three illustrative examples, the glass substrate or substrates will preferably be coated on their external face, on the opposite side from the structure 1, with an antireflection coating. In the case of Example 1 or 3, the PET covering sheet 12 may advantageously include an antireflection coating by means of a heat-sensitive or ultraviolet-crosslinkable resin.

The invention claimed is:

1. An optical filtering/electromagnetic screening structure to be joined to at least one transparent substrate, the structure comprising:
   at least first and second plastic sheets; and
   a conducting electromagnetic screening element between the first and second plastic sheets,
   wherein at least one of the first and second sheets is made of a thermoplastic, the other of the first and second sheets constitutes a covering sheet for covering the conducting element or the thermoplastic sheet, and
   wherein one of the first and second sheets is neutral to light while the other of the first and second sheets includes at least two pigments or dyes that provide an orange filter and an infrared filter, respectively, the orange filter filtering out light having a wavelength centered on 590 nm.

2. The structure according to claim 1, wherein the at least two pigments or dyes form the infrared filter in the 800 to 1250 nm wavelength range.

3. The structure according to claim 1, wherein the conducting element is formed from a metal wire gauze joined between the first and second sheets.

4. The structure according to claim 1, wherein the conducting element is formed from a metal wire mesh deposited on a support sheet whose composition is based on one of following materials: polycarbonate, polymethyl (meth)acrylate, polyethylene terephthalate, polyethersulphone, polyetherketone, and acrylonitrile-styrene copolymer.

5. The structure according to claim 4, wherein the support sheet for the conducting element constitutes the covering sheet, the conducting element being placed between the thermoplastic first sheet and the covering sheet.

6. The structure according to claim 4, wherein the covering sheet bearing the conducting element is coated on an opposite side from the conducting element with a protective film made of polyethylene terephthalate (PET), or of polyvinyl chloride (PVC), or of polypropylene, or of high-density polyethylene, with a thickness of less than or equal to 60 µm.

7. The structure according to claim 4, wherein the support sheet for the conducting element is formed from a third plastic sheet that is laminated between the thermoplastic first sheet and the covering sheet.

8. The structure according to claim 1, wherein the conducting element is formed from a metal layer, deposited on the covering sheet, the element being placed between the covering sheet and the thermoplastic first sheet.

9. The structure according to claim 1, wherein the thermoplastic first sheet and the covering sheet when the covering sheet does not constitute a support sheet for the conducting element are made of polyvinyl butyral, or of polyurethane, or of ethylene-vinyl acetate.

10. The structure according to claim 1, wherein the thermoplastic first sheet is joined to a single transparent substrate.

11. The structure according to claim 9, wherein the transparent substrate has, on a face that faces the thermoplastic sheet, a metal layer to form the conducting element when the conducting element is joined to the structure.

12. The structure according to claim 9, wherein the infrared filter has a corresponding light transmission not exceeding 22%, and the orange filter has a corresponding light transmission of between 20% and 40%, the structure having a light transmission coefficient in the visible light of between 40% and 60%, with a less than 3% purity.

13. The structure according to claim 12, wherein the infrared filter ensures transmission at 815 nm of at most 22%, transmission at 870 nm of at most 18%, and transmission between 900 and 1250 nm of at most 12%.

14. A display screen, having on a front face of glass substrates a structure according to claim 10.

15. The screen according to claim 14, wherein at least one of the glass substrates is made of toughened glass.

16. The screen according to claim 14, wherein at least one of the glass substrates has an antireflection coating on an opposite face from the structure.

17. The screen according to claim 14, wherein the covering sheet has an antireflection coating on an opposite face from the plastic sheet made of thermoplastic.

18. The screen according to claim 14, wherein the structure is adhesively bonded directly to the front face of the screen.

19. The structure according to claim 1, wherein the structure is laminated between two transparent substrates, the thermoplastic sheet and the covering sheet being joined to each of the substrates, respectively.

20. The structure according to claim 1, wherein the first and second plastic sheets with the conducting electromagnetic screening element in between is a thermally affixed composite comprising from the first and second plastic sheets thermoplastics by which the composite is affixed together.

* * * * *